United States Patent [19]
Suh et al.

[11] Patent Number: 5,525,585
[45] Date of Patent: Jun. 11, 1996

[54] PROCESS FOR PREPARING $YBA_2CU_3O_{7-x}$ SUPERCONDUCTORS

[75] Inventors: Jeong-Hun Suh, Taijeon; Young A. Jee, Seoul; Suk-Joong L. Kang, Taijeon; Duk Y. Yoon, Seoul, all of Rep. of Korea

[73] Assignee: Korea Advanced Institute of Science and Technology, Taijeon, Rep. of Korea

[21] Appl. No.: 261,298

[22] Filed: Jun. 16, 1994

Related U.S. Application Data

[63] Continuation of Ser. No. 66,418, May 25, 1993.

[30] Foreign Application Priority Data

Nov. 14, 1992 [KR] Rep. of Korea .................. 92-21432

[51] Int. Cl.$^6$ .................. C04B 35/626; C04B 35/45; C04B 35/505; C04B 35/653
[52] U.S. Cl. .................. 505/490; 505/430; 505/740; 505/741; 505/813; 505/821; 505/126; 505/780; 505/450; 505/451; 505/500; 505/742; 505/785; 505/725; 252/521
[58] Field of Search .................. 505/126, 780, 505/450, 451, 500, 736, 742, 785, 725, 490, 430, 740, 741, 813, 821; 423/604, 593; 501/123, 126, 152; 252/518, 521; 427/212

[56] References Cited

U.S. PATENT DOCUMENTS

| | | | |
|---|---|---|---|
| 4,937,228 | 6/1990 | Takahashi | 505/740 X |
| 4,952,554 | 8/1990 | Jin | 505/704 |
| 4,994,437 | 2/1991 | Torii | 505/452 |
| 5,037,801 | 8/1991 | Kloucek | 505/740 X |
| 5,049,539 | 9/1991 | Smialek | 505/232 |
| 5,084,436 | 1/1992 | Morimoto | 505/785 X |
| 5,206,213 | 4/1993 | Cuomo et al. | 505/742 X |
| 5,231,076 | 7/1993 | Jeong | 505/742 |
| 5,232,907 | 8/1993 | Matsuhiro | 505/742 |
| 5,240,903 | 8/1993 | Shimoyama | 505/785 |
| 5,248,660 | 9/1993 | Lee et al. | 505/742 X |
| 5,284,823 | 2/1994 | Chou et al. | 505/490 X |
| 5,306,700 | 4/1994 | Hojaji | 505/742 X |

FOREIGN PATENT DOCUMENTS

| | | | |
|---|---|---|---|
| 2311391 | 12/1990 | Japan | 505/742 |
| 3065509 | 3/1991 | Japan | 505/742 |
| 0112810 | 5/1991 | Japan | 505/742 |
| 9004856 | 5/1990 | WIPO | 505/742 |

OTHER PUBLICATIONS

Yamada "Critical current density of wire type Y–Ba–Cu–oxide superconductor" *Jap. Jnl. of Appl. Phys.* v. 27/5) May 1987 pp. L 2865–L 2866.

Kase "Preparation of Y–Ba–Cu–O Superconductors w/ high critical . . ." *Jap. Jnl. Appl. Physics* v. 29(2) Feb. 1990 pp. L 277–L 279.

P. Chaudhari et al., "Direct Measurement of the Superconducting Properties of Single Grain Boundaries in $Y_1Ba_2Cu_3O_{7-\delta}$" *Physical Review Letters*, vol. 60, No. 16, pp. 1653–1656 (18 Apr. 1988).

J. Mannhart et al., "Critical Currents in [001] Grains and across Their Tilt Boundaries in $YB_2Cu_3O_7$ Films" *Physical Review Letters*, vol. 61, No. 21, pp. 2476–2479, (21 Nov. 1988).

M. Murakami et al., "A New Process with the Promise of High $J_c$ in Oxide Superconductors" *Japanese Journal of Applied Physics*, vol. 28, No. 7, pp. 1189–1194 (Jul. 1989).

M. Murakami et al., "Melt Processing of High–Temperature Superconductors" *High Tc Information Service*, vol. 3, No. 5, (May, 1990).

J. W. Ekin, "Transport Critical Current in Bulk Sintered $Y_1Ba_2Cu_3O_x$ and possibilites for its Enhancement", *Advanced Ceramic Materials*, vol. 2, No. 3B, pp. 586–592 (1987) month not known.

Salama et al, "High Current Density in Bulk $YBa_2Cu_3O_x$ Superconductor", *Appl. Phys. Lett.*, vol. 54(23), pp. 2352–2354 (1989) month not known.

Dimos et al, "Orientation Dependence of Grain–Boundary Critical Currents in $YBa_2Cu_3O_{7-\delta}$ Bicrystals", *The American Physical Society*, vol. 61, No. 2, pp. 219–222 (1988) month not known.

Clarke et al, "Issues in the Processing of Cuprate Ceramic Superconductors", *J. Am. Ceram. Soc.*, vol. 72[7], pp. 1103–1113 (1989) month not known.

Bose et al, "A Simple Method for the Preparation of $YBa_2Cu_3O_x$ Superconducting Wires and Tapes Using Common Polymers", *Japanese Journal of Applied Physics*, vol. 30, No. 5A, pp. L 823–L 825 (1991) month not known.

Jin et al, "Melt–textured growth of Polycrystalline $YBa_2Cu_3O_{7-\delta}$ with High Transport $J_c$ at 77K", *The American Physical Society*, vol. 37, No. 13, pp. 7850–7853 (1988) month not known.

Murakami et al, "Microstructural Study of the Y–Ba–Cu–O System at High Temperatures", *Japanese Journal of Applied Physics*, vol. 28, No. 3, pp. L 399–401 (1989) month not known.

Cima, Michael J., et al., *J. Appl. Phys.*, 72 (1) (1 Jul. 1992), 179–90.

Bateman, Charles A., et al., *J. Am. Ceram. Soc.*, 75 (5) (May 1992), 1281–3.

Jin, S., et al., *Physical Review B*, 37 (13) (1 May 1988), 7850–3.

Jin, S., et al., *Appl. Phys. Lett.*, 52 (24) (13 Jun. 1988), 2074–6.

Chemical Abstracts, CA 115:268084 (1991).
Chemical Abstracts, CA 115:267980 (1991).
Chemical Abstracts, CA 113:143149 (1990).

*Primary Examiner*—Paul Lieberman
*Assistant Examiner*—Douglas J. McGinty
*Attorney, Agent, or Firm*—Burns, Doane, Swecker & Mathis

[57] ABSTRACT

The present invention provides a process for the preparation of $YBa_2Cu_3O_{7-x}$ superconductor which comprises surrounding a sintered material in which the molar ratio of Y:Ba:Cu is 2:1:1 with liquid-forming powder and subjecting the powder compact to isothermal heat-treatment at a temperature below the peritectic temperature of $YBa_2Cu_3O_{7-x}$. The $YBa_2Cu_3O_{7-x}$ superconductors prepared according to the present invention have aligned grain structure in one direction and thus exhibit a high critical current density.

6 Claims, 2 Drawing Sheets

PROCESS FOR PREPARING $YBA_2CU_3O_{7-x}$ SUPERCONDUCTORS

This application is a continuation of application Ser. No. 08/066,418, filed May 25, 1993.

BACKGROUND OF THE INVENTION

1. Field of the Invention

The present invention relates to an improvement in a process for preparing $YBa_2Cu_3O_{7-x}$ superconductors having a high critical current density. More particularly, the present invention is concerned with an isothermal peritectic reaction technique for preparing $YBa_2Cu_3O_{7-x}$ superconducting wires or tapes.

2. Description of the Prior Art

The discovery of high temperature superconductivity in copper-oxide compounds led to intense investigations and researches thereon owing to their immense industrial applicability. In contrast to the initial expectations, the progress toward major applications of the oxide-based superconducting wires and tapes has been hampered by their low critical current density values.

Specifically, polycrystalline $YBa_2Cu_3O_{7-x}$ (hereinafter, referred to as "123") superconductors have a lower critical current density (about $10^2$ A/cm$^2$) compared with single crystal or epitaxially grown thin films. It has been reported that such a low critical current density is mainly due to the anisotropy of electric conductivity, the second phases or impurities present in the grain boundaries, low sintering temperature, the presence of micro-crack and stress zone, and so forth. See, J. W. Ekin, Adv. Ceram. Mat., 2[3B], p.586 (1987); and S. Jin, T. H. Tiefel, R. C. Sherwood, M. E. Davis, R. B. van Dover, G. W. Kammlott, and R. A. Fastnacht, Phys. Rev. B., 37, p.7850 (1988).

It was discovered by Dimos et al. that the ratio of the critical current density at the grain boundaries to the critical current density within the grain decreases rapidly as the anisotropic angle of 123 bicrystal increases. See, P. Chaudhari, J. Mannhart, D. Dimos, C. C. Tsuei, J. Chi, M. M. Oprysko, and M. Scheuermann, Phys. Rev. Lett., 60, p.1653 (1988); D. Dimos, P. Chaudhari, J. Mannhart, and F. K. LeGoues, Phys. Rev. Lett., 61, p.219 (1988); J. Mannhart, P. Chaudhari, D. Dimos, C. C. Tsuei, and T. R. McGuire, Phys. Rev. Lett., 61, p.2476 (1988); and D. R. Clarke, T. M. Shaw, and D. Dimos, J. Am. Ceram. Soc., 72[7], p.1103 (1989). The above discovery indicates that such a low critical current density of oxide-based polycrystalline superconductors depends on the properties intrinsic to the grain boundaries and is affected concomitantly by the extrinsic factors such the second phases, micro-crack, low sintered density, and so on.

In order to improve the critical current density of 123 superconductors, it is necessary to minimize the problems involved in the grain boundaries by aligning the 123 grains in a direction. It has been reported that superconductors having a high critical current density of above $10^4$ A/cm$^2$ can be obtained by aligning the grains in a direction so that only the low angle grain boundaries are arranged in the direction of the current flow. See, S. Jin, T. H. Tiefel, R. C. Sherwood, M. E. Davis, R. B. van Dover, G. W. Kammlott, and R. A. Fastnacht, Phys. Ref. B, 37, p.7850 (1988); M. Murakami, M. Morita, K. Doi, K. Miyamoto, and H. Hamada, Jpn. J. Appl. Phys., 28[3], L399 (1989); M. Murakami, M. Morita, K. Doi, K. Miyamoto, Jpn. J. Appl. Phys, 28[7], p.1189 (1989); M. Murakami, H. Fujimoto, T. Oyama, S. Gotoh, Y. Shiohara, N. Koshizuka, and S. Tanaka, High Tc Information Service, Vol 3, No. 5 (1990); K. Salama, V. Selvamanickam, L. Gao and K. Sun, Appl. Phys. Lett., Vol. 54[23], p.2352 (1989).

The above prior art processes comprises heating a pre-sintered 123 specimen to a temperature higher than the peritectic temperature of 123 to obtain a melt and $Y_2BaCuO_5$ (hereinafter, referred to as "211") phase, and very slowly cooling the resultant. The time usually needed to prepare a wire of 1-2 cm long is a few tens of hours. Therefore, the process requires an extremely long period of time and a high temperature of above about 1,000° C.

K. Bose et al. proposes a process for preparing superconducting wires or tapes, which comprises mixing $YBa_2Cu_3O_{7-x}$ powder with certain polymers, and compressing the resulting mixture into a wire or tape shape followed by sintering below the peritectic temperature of 123. See, K. Bose, "A Simple Method for the Preparation of $YBa_2Cu_3O_x$ Superconducting Wires and Tapes Using Common Polymers," Jap. J. Appl. Phys. Vol. 30[5A], p. L823 (1991). According to this process, 123 wires or tapes can be prepared in a continuous manner at a relative low temperature for a short period of time. However, the resulting 123 super-conductors are hardly used in the practical application owing to their critical current density less than about $10^2$ A/cm$^2$.

We, the inventors of the present application, have intensively conducted a wide range of experiments in order to solve the problems encountered in the prior art processes. As a result, the inventors have now developed an isothermal peritectic reaction (IPR) process by which superconductors having a high critical current density can be obtained by heat-treatment at a lower temperature and for a shorter period of time as compared with the conventional melting techniques.

SUMMARY OF THE INVENTION

It is, therefore, object of the invention to provide an improved process for preparing superconductors having a high critical current density by means of isothermal peritectic reaction (IPR) process.

It is another object of the invention to provide a process for preparing superconducting wires or tapes in a continuous manner at a relatively low temperature for a short period of time.

It is still another object of the invention to provide superconductors having a high critical current density.

Any additional objects of the invention will become apparent through reading the remainder of the specification.

These and other objects of the invention have been accomplished by an improved process of the invention which comprises surrounding a pre-sintered cold-molded 211 material with liquid-forming powder to give a compact and subjecting the compact to isothermal heat-treatment at a temperature below the peritectic reaction temperature of 123 superconductors.

DISCLOSURE OF THE INVENTION

Figure 1:
FIG. 1 illustrates micrograph showing well aligned 123 grains in a disc-type specimen prepared by IPR process developed in the present invention.

According to the present invention, the sintered cold-molded material is first prepared. The preparation method thereof is known in the art. For example, $Y_2O_3$, $BaCO_3$ and CuO powders are mixed in a Y:Ba:Cu molar ratio of 2:1:1, and the mixture is then calcined at a temperature of about 900° to 950° C. for about 20 to 25 hours to synthesize 211 powder. The resulting powder is cold-molded, for example, in the form of disc or wire under pressure and sintered in air at a temperature of 1,000° to 1,100° C. for about 10 to 20 hours.

Independently, $BaCO_3$ and CuO powders are mixed in a Ba:Cu molar ratio of 3:5, and then calcined at a temperature of about 850° to 900° C. for about 25 to 30 hours in order to make the liquid-forming powder.

The 211 sintered cold-molded material is surrounded with the liquid-forming powder. The resulting compact is then subject to heat-treatment under oxygen atmosphere at a temperature of about 800° to 1,000° C. for 15 to 50 hours, preferably 20 hours to obtain 123 phase. During the heat-treatment, the following reaction occurs.

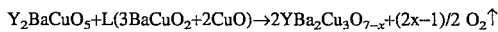

$$Y_2BaCuO_5 + L(3BaCuO_2 + 2CuO) \rightarrow 2YBa_2Cu_3O_{7-x} + (2x-1)/2\ O_2\uparrow$$

wherein, L represents a liquid phase at the temperature of the heat-treatment, namely, below the peritectic temperature, and x is less than 1.

The 123 superconductor with an aligned grain structure in the form of a disc is prepared by conducting heat-treatment at 945° C. for 20 hours under oxygen atmosphere. Alternatively, the heat-treatment may be carried out in two steps of heating at 945° C. for 6 hours and then at 965° C. for 14 hours. In order to prepare a 123 superconducting wire, it is preferred to use an elevated temperature of about 10° C. higher than that in the case of producing the same in the form of a disc.

The process for preparing $YBa_2Cu_3O_{7-x}$ by using the IPR process according to the invention, in which the liquid-forming powder is infiltrated into the 211 pre-sintered cold-molded material at a temperature below the peritectic temperature of 123 phase has advantages that:

First, the process is completed within a relatively short period of time and can be carried out continuously;

Second, a dense 123 phase can be obtained, attributing to the liquid phase participated in the reaction;

Third, an aligned grain structure can be obtained, attributing to the direction of the liquid infiltration from the surface of the sintered cold-molded 211 material; and Fourth, the pinning effect by the 211 grains distributed within the formed 123 grains can be expected in the final product.

PREFERRED EMBODIMENT OF THE INVENTION

The present invention will be described in greater detail by way of the following examples. The examples are presented for illustrative purpose only and should not be construed as limiting the invention which is properly delineated in the claims.

EXAMPLE 1

Five sets of $YBa_2Cu_3O_{7-x}$ superconductors in the form of disc were prepared according to the following procedures:

$BaCO_3$ and CuO powders were mixed in a Ba:Cu molar ratio of 3:5. The resulting mixture was calcined at 870° C. for 26 hours to synthesize liquid-forming powder ($3BaCuO_2 + 2CuO$).

Separately, $Y_2O_3$, $BaCO_3$ and CuO powders were mixed in a Y:Ba:Cu molar ratio of 2:1:1. The resulting mixture was calcined at 925° C. for 23 hours to synthesize $Y_2BaCuO_5$ powder. The $Y_2BaCuO_5$ powder was then cold-molded in a disc form under pressure and sintered in air at 1,050° C. for 15 hours to give a 211 compact.

Subsequently, the $Y_2BaCuO_5$ material thus sintered and cold-molded was surrounded with the liquid-forming powder. The resulting compact was subject to a cycle of heating under oxygen atmosphere to give $YBa_2Cu_3O_{7-x}$ specimens. The heating temperature and times were shown in Table I below.

TABLE I

| Specimen No. | 945° C. | 965° C. | Atmosphere |
| --- | --- | --- | --- |
| 1 | 20 hours | — | $O_2$ |
| 2 | — | 20 hours | $O_2$ |
| 3 | 40 min. | 19 hours plus 20 min. | $O_2$ |
| 4 | 2 hours | 18 hours | $O_2$ |
| 5 | 6 hours | 14 hours | $O_2$ |

Figure 2:
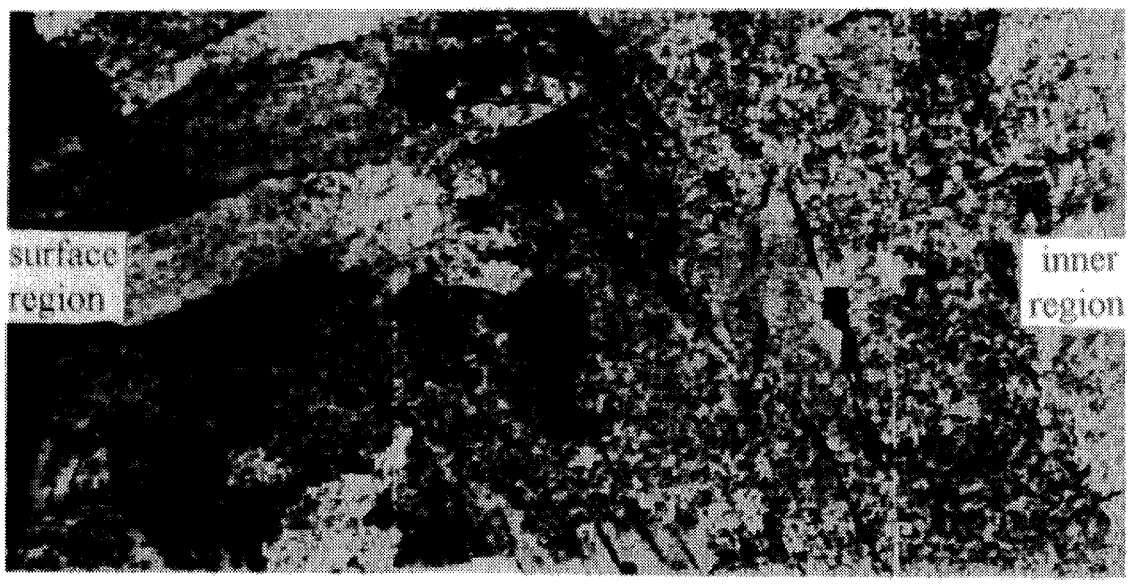
FIG. 2 illustrates micrograph showing poorly aligned 123 grains in a disc-type specimen.

Among the above, Specimens 1 and 5 showed good alignment of 123 grains as shown in FIG. 1. Although the grains at the surface region are randomly oriented, the grains grown in the interior of the specimen are well aligned toward the center of the specimen. In contrast, the Specimen 2 showed randomly oriented grain structure as shown in FIG. 2. This is believed to be due to the high temperature employed in the heat-treatment. Specimens 3 and 4 also showed randomly oriented grains. This was believed to be due to the shortage of heat-treatment time at 945° C.

EXAMPLE 2

Figure 3:
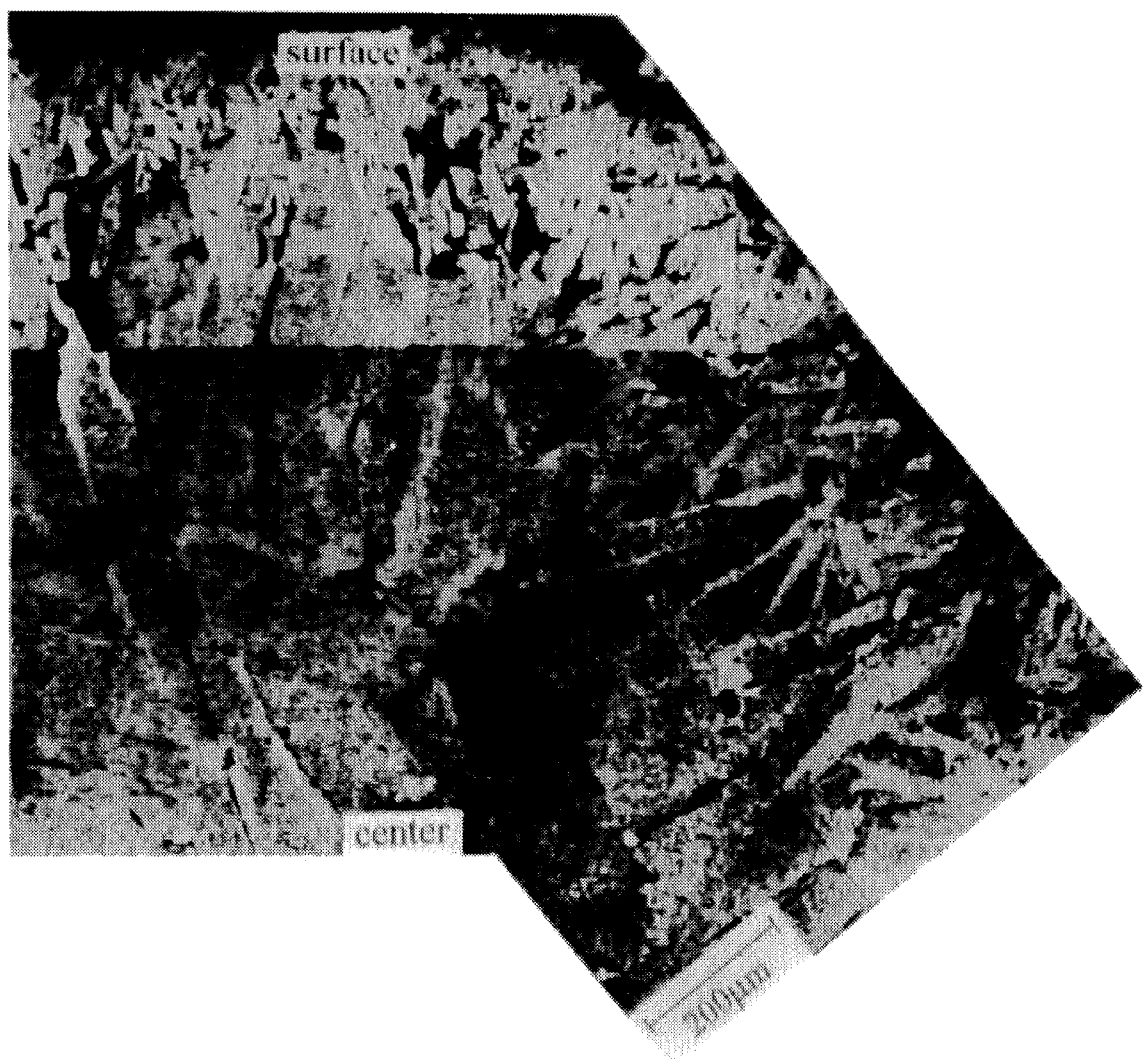
FIG. 3 illustrates micrograph showing well aligned 123 grains in a wire-type specimen prepared by IPR process developed in the present application.

$YBa_2Cu_3O_{7-x}$ superconductors in the form of wire were prepared by grinding the 211 sintered material prepared in Example 1 on SiC paper to give specimens in the form of short wire. Each specimen thus obtained was surrounded with the same liquid-forming powder as in Example 1 and then subject to heat-treatment. The wire specimen having a well aligned grain structure, as shown in FIG. 3, was obtained by conducting the heat-treatment at a temperature about 10° C. higher than that in the production of the specimen in the form of disc. The critical current density of the 123 superconducting wire was measured to be 1,200 $A/cm^2$. This value is about 10 times higher than that (about 100 $A/cm^2$) of the sintered material prepared by the conventional sintering methods.

What is claimed is:

1. A method of aligning $YBa_2Cu_3O_{7-x}$ (123) grains in the production of 123 superconductors, comprising the steps of:
   a) preparing a sintered cold-molded material comprising $Y_2BaCuO_5$;
   b) preparing a liquid-forming powder comprising $BaCuO_2$ and CuO in a molar ratio of 3:2;
   c) surrounding the sintered cold-molded material of step a) with the liquid-forming powder of step b), thereby forming a compact having a weight ratio of sintered material cold-molded to liquid-forming powder of 1:at least 1.8; and d) subjecting the compact of step c) to isothermal heat treatment at a temperature above the melting point of the liquid-forming powder and below the peritectic temperature of $YBa_2Cu_3O_{7-x}$, thereby infiltrating the liquid-forming material into the sintered cold-molded material to give a $YBa_2Cu_3O_{7-x}$ superconductor, wherein x is less than 1.

2. The process according to claim 1, wherein the heat treatment is carried out under oxygen atmosphere.

3. The process according to claim 2, wherein the heat treatment is carried out at a temperature of 800° to 1000° C. for 15 to 50 hours.

4. The process according to claim 1, wherein the $YBa_2Cu_3O_{7-x}$ superconductor is in the form of a wire or tape.

5. The process according to claim 1, wherein the liquid-forming powder is formed by mixing $BaCO_3$ and $CuO$ in a Ba:Cu molar ratio of 3:5 and calcining the resulting mixture at a temperature of about 850° to 900° C. for about 25 to 30 hours.

6. The method according to claim 1 wherein the sintered material of a) is in the form of a wire or a disc.

* * * * *